United States Patent [19]

Tanaka et al.

[11] Patent Number: 4,598,304
[45] Date of Patent: Jul. 1, 1986

[54] THIN FILM DEVICES OF SILICON

[75] Inventors: Kazunobu Tanaka; Akihisa Matsuda, both of Ibaraki; Toshihiko Yoshida, Tokyo, all of Japan

[73] Assignees: Agency of Industrial Science & Technology; Toa Nenryo Kogya, K.K., both of Tokyo, Japan

[21] Appl. No.: 790,781

[22] Filed: Oct. 23, 1985

Related U.S. Application Data

[60] Continuation of Ser. No. 633,751, Jul. 23, 1984, abandoned, which is a division of Ser. No. 394,074, Jul. 1, 1982, Pat. No. 4,490,208.

[30] Foreign Application Priority Data

Jul. 8, 1981 [JP] Japan .................. 56-105703
Jul. 8, 1981 [JP] Japan .................. 56-105704

[51] Int. Cl.⁴ ............... H01L 49/02; H01L 31/06
[52] U.S. Cl. ........................ 357/4; 136/258; 136/261; 357/2; 357/30; 357/90
[58] Field of Search ............. 136/258 PC, 258 AM, 136/261; 357/2, 4, 30, 90

[56] References Cited

U.S. PATENT DOCUMENTS

| 4,058,418 | 11/1977 | Lindmayer | 148/175 |
| 4,217,374 | 8/1980 | Ovshinsky et al. | 427/39 |
| 4,251,289 | 2/1981 | Moustakas et al. | 136/255 |
| 4,321,420 | 3/1982 | Kaplan et al. | 136/255 |
| 4,433,202 | 2/1984 | Maruyama et al. | 136/255 |

FOREIGN PATENT DOCUMENTS 58-132983 8/1983 Japan .................. 136/258 AM

OTHER PUBLICATIONS

R. V. D'Aiello et al., "Epitaxial Silicon Solar Cells", *Applied Physics Letters*, vol. 28, pp. 231–234 (1976).
N. Sol et al., "Post-Hydrogenation of CVD Deposited a-Si Films", *J. Non-Crystalline Solids*, vol. 35–36, pp. 291–296 (1980).

*Primary Examiner*—Aaron Weisstuch
*Attorney, Agent, or Firm*—Seidel, Gonda, Goldhammer & Abbott

[57] ABSTRACT

A p-type or n-type thin film of silicon has the concentration of an impurity dopant element decreased adjacent to a boundary of film. The impurity dopant element in the portion of the silicon film from the surface to a predetermined depth is replaced by an element selected from the group consisting of fluorine, chlorine, bromine, iodine, and hydrogen.

15 Claims, 5 Drawing Figures

THIN FILM DEVICES OF SILICON

This application is a continuation, of application Ser. No. 633,751, filed 7/23/84, now abandoned which is a division of application Ser. No. 394,074, filed 7/1/82, U.S. Pat. No. 4,490,208.

BACKGROUND OF THE INVENTION

This invention relates to thin films of silicon useful in such applications as diodes, solar cells, image pick-up tubes, electrographic printers for readers and the like.

To suit their intended uses, thin films of silicon have been employed alone or generally in the form of p-i-n or p-n junction devices. Those devices are usually made in a process combining two or three film-forming steps, viz., by first forming a p-type thin film of silicon doped, e.g., with boron (B) as an impurity element, in a plasma atmosphere by glow discharge, and then allowing to grow thereon either an undoped i-type thin film of silicon as an active layer and an overlying phosphorus (P) doped n-type thin film of silicon or the latter directly without the intermediate layer. Alternatively, in a similar but reversed way, a thin film to constitute an n-type layer is formed first and then either i- and p-type layers are deposited thereon or the p-type layer is deposited directly on the n-type layer. A disadvantage common to the devices made by the conventional film-forming techniques is that, in the course of deposition of another layer over a grown layer, the impurity in the underlying (already grown) film tends to be released in the plasma atmosphere and gain entrance into the film being formed thereon. Consequently, as compared with a film deposited on an impurity-free substrate, the film that has grown up on an impurity-containing backing shows decreases in photoelectric and dark electric conductivities. This is particularly true with a p-i-n junction semiconductor device, consisting of a substrate and p-, i-, and n-type layers deposited thereon in order of mention, for fabrication into a solar cell. Ingress of the dopant impurity from the p-type to the i-type film lowers the photoelectric and dark electric conductivities and renders it impossible to provide good junctions. On the other hand, a device formed in the backward order, i.e., of the substrate, n-, i-, and p-type layers, cannot obtain adequate open voltage because the partial transfer of the impurity from the n-type to the i-type film causes a shift of the Fermi level position. Altogether, the aforesaid drawbacks lead to a decline in the photoenergy conversion efficiency, and those junctions in fact affect adversely the performance of the solar cells and other end products incorporating the same.

The present inventors have now found that, if a p- or n-type thin film of silicon doped with an impurity element is placed under a plasma discharge of the gas of at least one element chosen from among fluorine, chlorine, bromine, iodine, and hydrogen, the p- or n-type film will show a decrease in its impurity concentration in the portion from the surface to a depth of 5000 Å, and the dangling bonds that have resulted from the removal of the impurity from the p- or n-type silicon film are replaced by the plasma discharge gas, thus forming a barrier layer to avoid further release of the impurity from the silicon film in the plasma atmosphere.

It has also been found that the degree of impurity decrease in the thin film of silicon and the depth of film portion in which the impurity decrease takes place can be varied over broad ranges by adjusting the pressure during the plasma discharge inside the vacuum vessel, discharge time, and power density for discharge.

The pressure during the discharge, one of the essential parameters for practicing the method of the invention, is controlled desirably within a range from $1.5 \times 10^{-2}$ to 3 torrs. If the discharge pressure is less than $1.5 \times 10^{-2}$ torr, the flow inside the vacuum vessel will become a diffusion or nonlaminar one with an increasing possibility of the once released impurity finding entrance back into the silicon film substrate. Thus, in order to keep the flow inside the vessel viscous laminar, the pressure should be not less than $1.5 \times 10^{-2}$ torr. The upper limit of 3 torrs is determined primarily by reason of apparatus factors, so as to prevent any discharge between the electrodes and the earth shields. The discharge power density varies depending on the properties of the plasma gas to be employed but a value between 0.5 and 50 $W/cm^2$ is suitable. Under these conditions the discharge time is variable as desired within a range from one second to five hours. With regard to the relation between the discharge power density and the discharge time, it may generally be said that the discharge power density influences the depth of the film portion in which the impurity element originally added as a dopant decreases, while the discharge time influences the decrease in the originally added impurity concentration.

The flow rate of the plasma element gas into the vacuum vessel to bring a plasma state must be so fixed as to stably maintain the plasma state. Experiments have indicated that a flow rate ranging from 0.5 to 100 SCCM gives a good result.

The present invention is predicated upon the aforedescribed novel findings. Briefly, the method of producing thin films according to this invention is distinguishedly characterized in that a p-type or n-type thin film of silicon is placed in a state of plasma discharge of the gas of at least one element chosen from among fluorine, chlorine, bromine, iodine, and hydrogen, whereby the impurity concentration in the portion of the p- or n-type silicon film to a desired depth down to 5000 Å from the surface is decreased and the dangling bonds that have resulted from the impurity removal are replaced by the plasma discharge gas.

Thus, the p-type or n-type thin film of silicon produced in accordance with the invention, when subjected to a low-power plasma discharge in the next process stage for deposition thereon, e.g., of an i-type film layer, will not release its impurity into the latter layer.

When a film is caused to grow in a plasma atmosphere on an n-type or p-type thin film substrate formed in a conventional way, the additional film will contain more than $10^{16}$ atoms/$cm^3$ of the impurity from the substrate film. In contrast with that, when a film is grown likewise on a similar substrate formed by the method of the invention, the release of the impurity from the substrate film to the overlying film can be controlled to be a maximum of $10^{16}$ atoms/$cm^3$.

Therefore, it is a primary object of this invention to provide a p-type or n-type thin film of silicon which, upon exposure to a given plasma atmosphere, will release no (or little, if any) impurity with which it is doped to the exterior.

Another object of the invention is to provide thin films of silicon useful in fabricating solar cells, image pick up tubes, electrographic printers for readers, diodes, etc., with good photoelectric and dark electric conductivities.

Other objects and advantages of the invention will become more apparent when reference is made to the following description and accompanying drawings.

DISCLOSURE OF THE INVENTION

In producing the thin film of the present invention a p-type or n-type thin film of silicon, such as a single-crystal semiconductor of silicon or an amorphous silicon semiconductor made by depositing a mixture of silane ($SiH_4$) and a dopant gas as a gaseous starting material on a given substrate in a plasma atmosphere may be used. Also employable as a further alternative is the thin silicon film disclosed in a copending application by this applicant (Japanese Patent Application No. 143010/1980). The application discloses a thin film of silicon formed by mixing a dopant gas with either silane ($SiH_4$), or a halogenated silane ($SiH_{0-3}X_{4-1}$), where X represents a halogen element, or a gaseous mixture of two or more such silanes, as a gaseous starting material; diluting the gaseous mixture with helium, neon, argon or other rare gas, hydrogen, or the like in a ratio greater than about 1:1 so as to control the film-forming rate adequately and produce a crystalline-noncrystalline mixture layer; and applying an electric power with a plasma discharge power density of not less than about 0.2 W/cm$^2$.

The method of producing thin films of silicon in accordance with the invention will be described below in connection with examples thereof.

EXAMPLE 1

Figure 1:
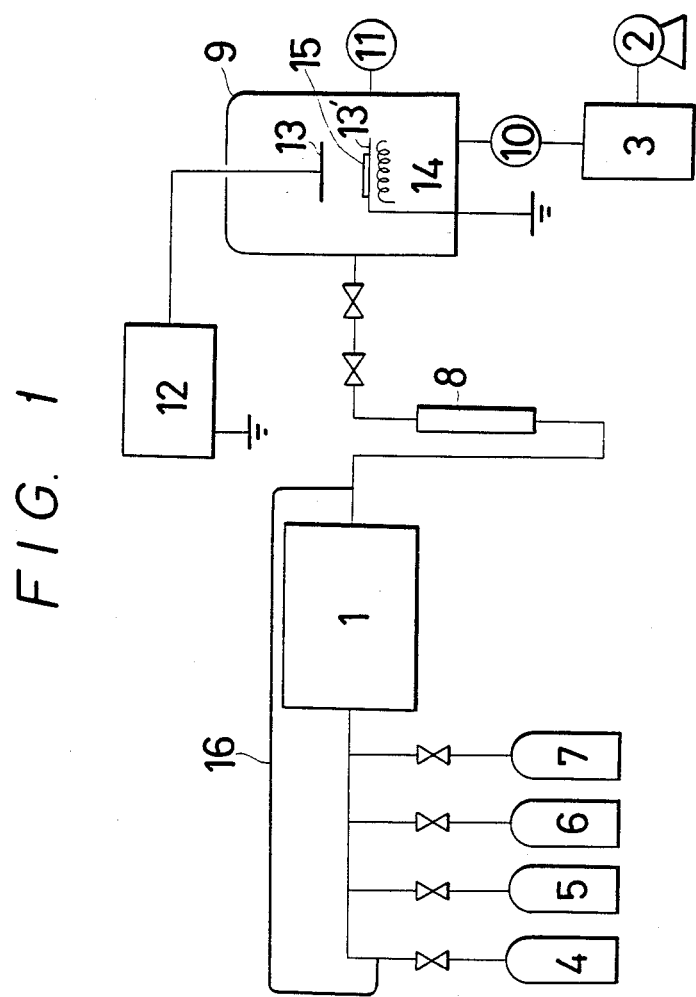
FIG. 1 is a schematic representation of an apparatus for practicing a first method of producing a thin film of silicon in accordance with the invention.

Referring to FIG. 1, the whole system including a mixing vessel 1 is kept at a vacuum degree of about $10^{-6}$ torr by means of an oil rotating pump 2 and an oil diffusion pump 3. The gases from a silane cylinder 4, hydrogen cylinder 5, and either a dopant gas (diborane or phosphine) cylinder 6 or 7 are introduced at predetermined rates into the mixing vessel 1, where they are mixed. The gaseous mixture is transferred through a flowmeter 8 into a vacuum vessel 9 at a constant flow rate. The vacuum in the vessel 9 is monitored with a vacuum indicator 11 and is maintained at a predetermined level through manipulation of main valve 10. An RF power supply 12 applies an RF voltage between electrodes 13 and 13' to cause a glow discharge. A substrate 15 is placed on a base preheated by a heater 14 and is heated to a predetermined temperature so as to be ready for the deposition thereon of a thin, doped film of silicon.

In this example the starting gaseous material was a 1:1 mixture of $SiH_4$ and $H_2$, with the addition of 2% (by volume) of diborane ($B_2H_6$) on the basis of the $SiH_4$ volume. The conditions under which a p-type thin film of silicon was formed prior to a treatment in a hydrogen plasma atmosphere were as follows: the plasma-discharge power density was 0.1 W/cm$^2$, material gas flow rate was 15 SCCM, substrate temperature was 300° C., and film-forming pressure was $5 \times 10^{-2}$ torr.

After the thin film of silicon was formed in the foregoing way, the whole system including the vessel 9 was evacuated to about $10^{-6}$ torr by the pumps 2, 3. Next, hydrogen gas from the hydrogen cylinder 5 was directly supplied through line 16 to the flowmeter 8 and thence into the vacuum vessel 9 at a constant flow rate. The main valve 10 was operated and the vacuum in the vessel 9 was adjusted to 1 torr under observation through the vacuum indicator 11. Then, a high-frequency voltage of 13.56 MHz was applied between the electrodes 13 and 13' by the RF power supply 12 to effect a hydrogen-plasma glow discharge.

TABLE 1

| | Specimen No. | | | | |
|---|---|---|---|---|---|
| | 1 | 2 | 3 | 4 | 5 |
| Power density (W/cm$^2$) | — | 0.8 | 0.8 | 0.8 | 0.8 |
| Substrate temp. (°C.) | — | 300 | 300 | 300 | 300 |
| Discharge pressure (Torr) | — | 1 | 1 | 1 | 1 |
| Hydrogen flow rate (SCCM) | — | 10 | 10 | 10 | 10 |
| Discharge time (min) | — | 3 | 7 | 30 | 60 |
| Electric conductivity ($\Omega^{-1}$ cm$^{-1}$) | $1.10 \times 10^{-4}$ | $3.69 \times 10^{-6}$ | $5.73 \times 10^{-7}$ | $4.55 \times 10^{-7}$ | $1.06 \times 10^{-6}$ |
| Optical band gap (eV) | 1.00 | 1.01 | 1.04 | 1.03 | 1.09 |
| Substrate conductivity type | Boron-doped p-type | | | | |

This gave a p-type, amorphous thin film of silicon whose surface portion had been freed of the impurity, with the resulting dangling bonds replaced by hydrogen. The hydrogen-plasma discharge condition, or discharge time, was varied and four different p-type, amorphous thin films of silicon were made. The results are shown in Table 1. Specimen No. 1 represents a p-type thin film of silicon made conventionally without subjection to a hydrogen plasma discharge. Specimen Nos. 2 to 5 are the p-type thin films of silicon made in conformity with the present invention, i.e., by a procedure such that the flow inside the apparatus was placed in a viscous flow region by adjusting the hydrogen gas flow rate and the pressure during the hydrogen plasma discharge so that the boron once released from the walls of the vacuum vessel and the thin film of silicon may not reenter the silicon film.

Figure 2:
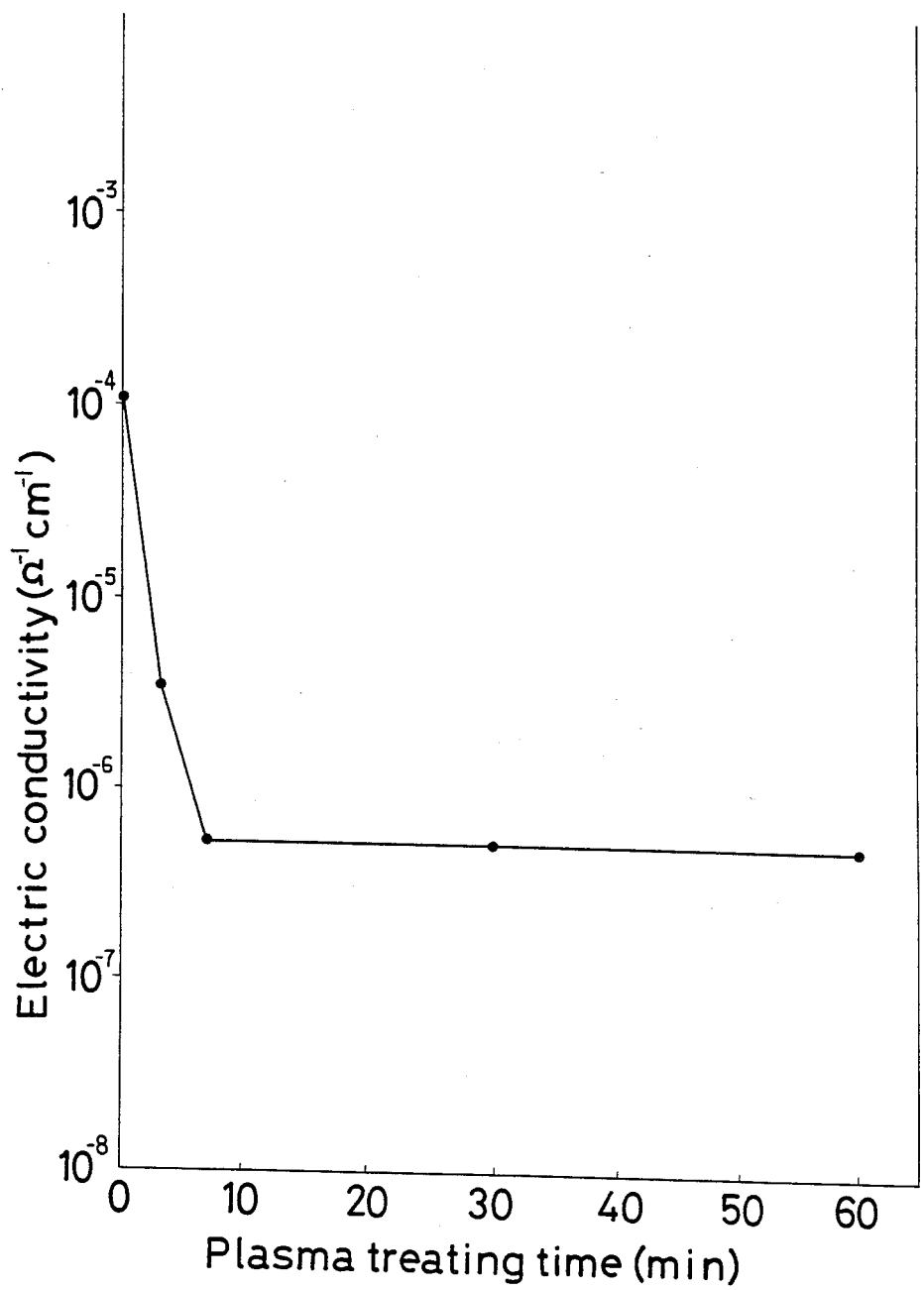
FIG. 2 is a graph showing the electric conductivity of the thin film of silicon made by the first method of the invention as a function of plasma discharge time.
Figure 3:
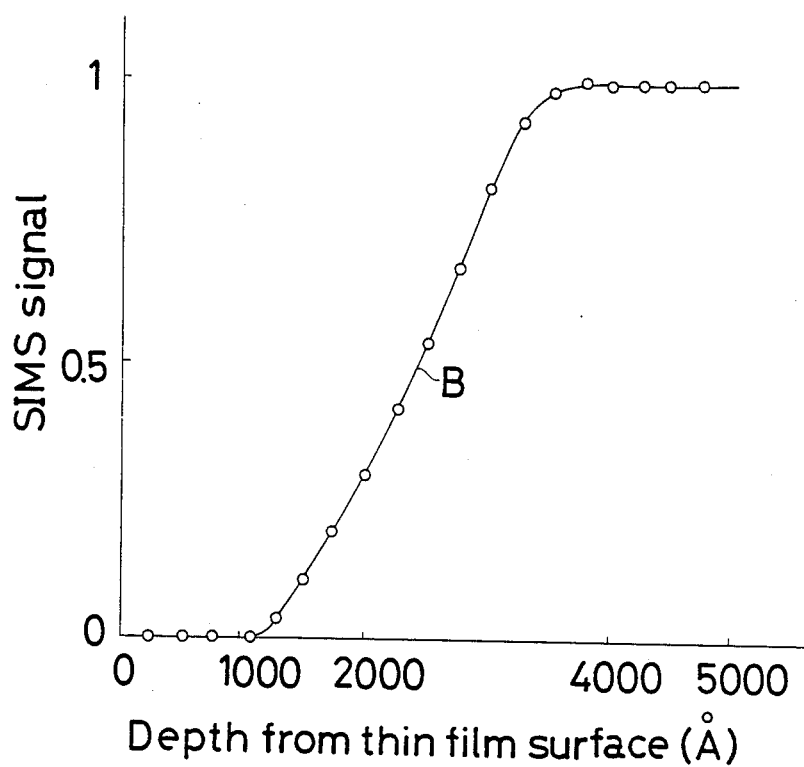
FIG. 3 is a graph in which the results of SIMS measurement of the thin silicon film produced by the first method are plotted.

FIG. 2 is a graphic representation of the electric conductivity of the thin silicon film made in accordance with the invention as a function of hydrogen-plasma treating time. The graph indicates that the method of the invention reduced the boron atom concentration in the surface portion of the silicon film. Also, it was confirmed by a SIMS measurement that the p-type thin film according to the invention was completely free from boron atoms in the portion from the surface to the depth of 1000 Å. The boron concentration increased substantially linearly from the portion free of boron to the central portion of the film in which the boron concentration was substantially constant. The substantially linear increase occurred between 1000 Å and 3500 Å from the surface. (Refer to FIG. 3.)

EXAMPLE 2

An n-type thin film of silicon was formed by the same procedure as described in Example 1 except that phosphine ($PH_3$) was used instead as the dopant, and the thin film so obtained was treated with a hydrogen plasma in the same way as in the preceding example.

By a SIMS measurement complete removal of phosphorus atoms from a 500 Å-deep portion of the n-type thin film according to the invention was confirmed.

From the foregoing description it will be understood by those skilled in the art that the p-type or n-type thin film of silicon produced by the method of the invention permits the manufacture of a pn or pin junction device by a subsequent step of ordinary film-forming technique. A pin-junction semiconductor device, made by depositing, on a p-type (or n-type) film formed in accordance with the invention, an i-type film and then an n-type (or p-type) film, provides a better p-i (or n-i) junction than existing devices of the character. Similarly, a p-n junction semiconductor device, obtained by depositing an n-type (or p-type) film on a p-type (or n-type) film according to the invention, gives a better p-n junction than ordinary ones. It is also possible to apply this invention to a p-type film substrate and thoroughly remove the impurity from the surface portion of the substrate film to convert the substrate to a p-i-type thin film of silicon. In that case an n-type film may be deposited on the p-i-type film to yield a p-i-n junction semiconductor device.

As a result of further researches and experiments, the present inventors have now found that, if a p- or n-type thin film substrate of silicon doped with an impurity element is placed under a plasma discharge of a gaseous mixture of the gas of at least one element selected from the group consisting of fluorine, chlorine, and hydrogen, and a gas of an impurity dissimilar to the impurity in the silicon film substrate, the silicon film substrate will show a decrease in its impurity concentration in the portion from the surface to a depth of 5000 Å while, at the same time, the substrate is doped to a desired depth with the dissimilar impurity in the gaseous mixture.

It has also been found that the degree of impurity decrease in the thin film substrate of silicon, the depth of the film portion in which the impurity decrease takes place, and the concentration and depth of doping with the new, dissimilar impurity in the same substrate can be varied over broad ranges by adjusting (1) the composition of the gaseous mixture to be placed under the plasma discharge conditions, (2) the pressure during, and the duration of, the plasma discharge in the vacuum vessel, and (3) the plasma-discharge power density.

The present invention is predicated upon the aforedescribed novel findings. Briefly, the method of producing thin films of silicon in accordance with the invention is distinguishedly characterized in that a thin film substrate of silicon doped with an impurity (A) is placed in a plasma discharge state of a gaseous mixture consisting of the gas of an element selected from the group consisting of fluorine, chlorine, and hydrogen, and a gas containing an impurity (B) dissimilar to the impurity (A) in the silicon film substrate, whereby the concentration of the impurity (A) is decreased in the portion of the silicon film substrate from the surface to a predetermined depth while, at the same time, the substrate is doped to a desired depth with the impurity (B).

Dangling bonds that have resulted from the removal of the impurity (A) presumably combine with fluorine or hydrogen atoms.

By way of example, it is assumed that a p-n junction device is made in accordance with the present invention by doping a p-type thin film of silicon containing boron atoms as impurity with phosphorus atoms diffused from one side. To this end, the p-type thin film substrate of silicon is exposed to a plasma discharge of a gaseous mixture which consists of either phosphine, $PH_3$, diluted with hydrogen or phosphorus pentafluoride diluted with fluorine. The result is that the boron atom concentration in the p-type silicon film substrate is reduced in the portion from the surface to a desired depth, simultaneously with doping to a given depth in the same substrate with phosphorus atoms out of the gaseous mixture. In this way a p-n junction device is made without the need of any film-forming process. Another example will be cited in which a p-n junction device is made under the invention by boron-atom doping of an n-type thin film substrate of amorphous silicon containing phosphorus atoms as impurity. In this case, the n-type silicon film substrate is exposed to a plasma discharge of a gaseous mixture which consists of diborane, $B_2H_6$, diluted with hydrogen or of boron trifluoride diluted with fluorine. This operation reduces the phosphorus atom concentration in the n-type silicon film substrate in the portion from the surface to a desired depth while, at the same time, doping the same film to a given depth with boron atoms out of the gaseous mixture. A p-n junction device is made in this way without any film-forming process.

In either case the depth of impurity reduction and the depth of doping with the other impurity can be controlled by changing the composition, or mixing ratio, of the gaseous mixture. By so doing, varied p-n junction devices and also p-i-n junction devices having various desired properties can be obtained. To be more specific, the composition of the gaseous mixture is a parameter as important as the pressure and duration of the discharge and the power density in practicing the method of the invention. The gas composition is such that, when the [impurity (B) gas/fluorine or hydrogen gas] ratio is low, the depth of doping from the surface with the new impurity (B) will be less than the depth down to which the concentration of the originally added impurity (A) is decreased in the silicon film substrate through the agency of fluorine or hydrogen. Therefore, the resulting device is a p-i-n junction. On the other hand, when the [impurity (B) gas/fluorine or hydrogen gas] ratio is high, the depth of the silicon film substrate portion in which the concentration of the impurity (A) is decreased by fluorine or hydrogen and the depth of doping with the new impurity (B) are substantially the same. Hence, the product is a p-n junction device. In the practice of this invention it has been found that a desirable gaseous mixture composition is $B_2H_6$, $BF_3/H_2$ or $PH_3$, $PF_5/H_2$ in a range of $10^{-5}$ to $10^{-1}$. The rate of flow of the gaseous mixture into the vacuum vessel must be so chosen as to keep the plasma condition stable. Experiments showed that a flow rate between 0.5 and 100 SCCM gives good result.

The pressure during the discharge, one of the essential parameters for practicing the method of the invention, is controlled desirably within a range from $1.5 \times 10^{-2}$ to 3 torrs. If the discharge pressure is less than $1.5 \times 10^{-2}$ torr, the flow inside the vacuum vessel will become a diffusion one with an increasing possibility of the once released impurity finding entrance back into the silicon film substrate. Thus, in order to keep the flow inside the vessel viscous, the pressure should be not less than $1.5 \times 10^{-2}$ torr. The upper limit of 3 torrs is determined primarily by reason of apparatus factors, so as to prevent any discharge between the electrodes and the earth shields. The discharge power density varies depending on the properties of the plasma gas to be employed but a value between 0.5 and 50 W/cm$^2$ is suitable. Under these conditions the discharge time is variable as desired within a range from one second to five hours. With regard to the relation between the discharge power density and the discharge time, it may generally be said that the discharge power density influences the depth of the film portion in which the impurity element originally added as a dopant decreases and also the depth of doping with the newly added impurity, while the discharge time influences the decrease in the originally added impurity concentration and the degree of doping with the new impurity.

EXAMPLE 3

Figure 4:
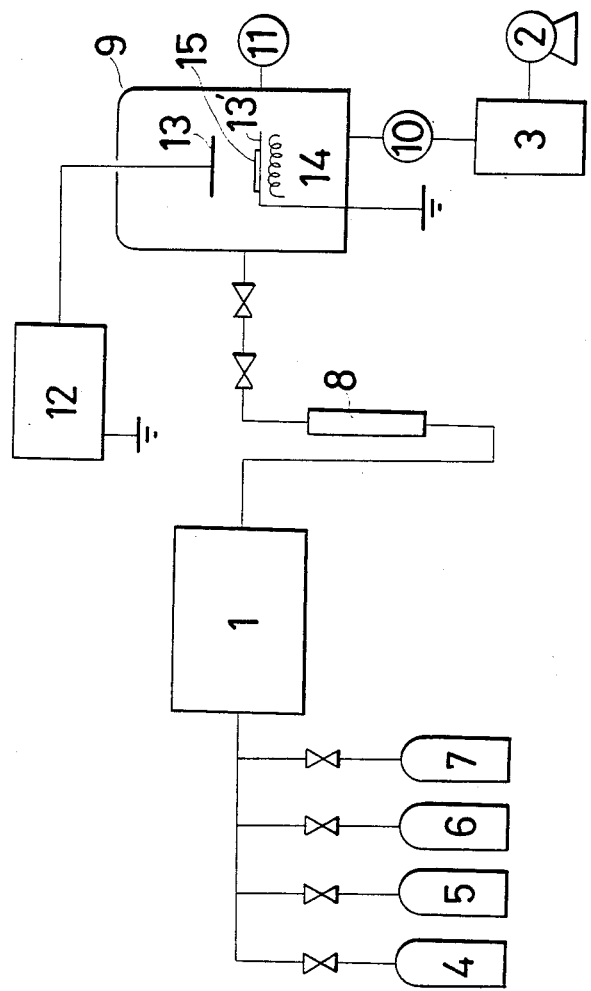
FIG. 4 is a schematic representation of an apparatus for practicing a second method of producing a thin film of silicon in accordance with the invention.

Referring to FIG. 4, the whole system including a mixing vessel 1 is kept at a vacuum degree of about $10^{-6}$ torr by means of an oil rotating pump 2 and an oil diffusion pump 3. The gases from a silane cylinder 4 or hydrogen cylinder 5, and either a dopant gas (diborane or phosphine) cylinder 6 or 7 are introduced at predetermined rates into the mixing vessel 1, where they are mixed. The gaseous mixture is transferred through a flowmeter 8 into a vacuum vessel 9 at a constant flow rate. Through manipulation of a main valve 10, the vacuum in the vessel 9, while being monitored with a vacuum indicator 11, is maintained at a predetermined level. The flow condition in the vacuum vessel is adjusted to be in a viscous flow region so as to prevent the impurity once released out of the substrate film from gaining entrance back into the film. This end is achieved primarily by maintaining a pressure of not lower than $1.5 \times 10^{-2}$ torr in the vacuum vessel. An RF power supply or DC source 12 is used to apply a high-frequency voltage between electrodes 13 and 13' to produce a glow discharge. As a substrate 15, either an n-type or p-type thin film substrate of silicon is employed. The substrate film desirably ranges in thickness from 0.1 to 1 μm, while a 0.7 μm-thick film was used in this example. The substrate 15 was placed on a base plate preheated by a heater 14, and is heated to a desired temperature. By the procedure so far described the thin film substrate of silicon is converted to a p-n or p-i-n junction device.

Table 2 summarizes this example of the method according to the invention. The film-forming conditions for the p-type thin film substrate of silicon used were as follows. A 1:1 gaseous mixture of SiH$_4$ and H$_2$ was used as the starting gaseous material, with the addition of 2% (by volume) of diborane, B$_2$H$_6$, as a dopant on the basis of the SiH$_4$ volume. The plasma-discharge power density was 0.1 W/cm$^2$, film-forming pressure was $5 \times 10^{-2}$ torr, material gas flow rate was 15 SCCM, and the film-forming time was 60 minutes. The p-type silicon substrate was made on an ITO transparent electrode under the film-forming conditions described in Example 1.

TABLE 2

|  | Spec. No. 1 | Spec. No. 2 |
|---|---|---|
| Carrier gas | H$_2$ | H$_2$ |
| Doping gas composition (by volume) | PH$_3$/H$_2$ = 2% | PH$_3$/H$_2$ = 2% |
| Gas flow rate (SCCM) | 5 | 5 |
| Power density (W/cm$^2$) | 1.3 | 0.8 |
| Substrate temperature (°C.) | 300 | 300 |
| Discharge pressure (torr) | $3 \times 10^{-1}$ | $3 \times 10^{-1}$ |
| Discharge time (min) | 60 | 30 |
| Substrate conductivity type | p | p |

The devices of Specimen Nos. 1 and 2 in Table 2 were found to be rectifying because of their V-i characteristics, and this indicated that actually p-n junction devices had been made.

Specimen No. 2 was subjected to an EMX measurement and was tested for gas release on heating. The results showed that the p-type silicon film had contained 4 atom % of phosphorus atoms as evidence of doping with phosphorus atoms according to the method of the invention.

EXAMPLE 4

Figure 5:
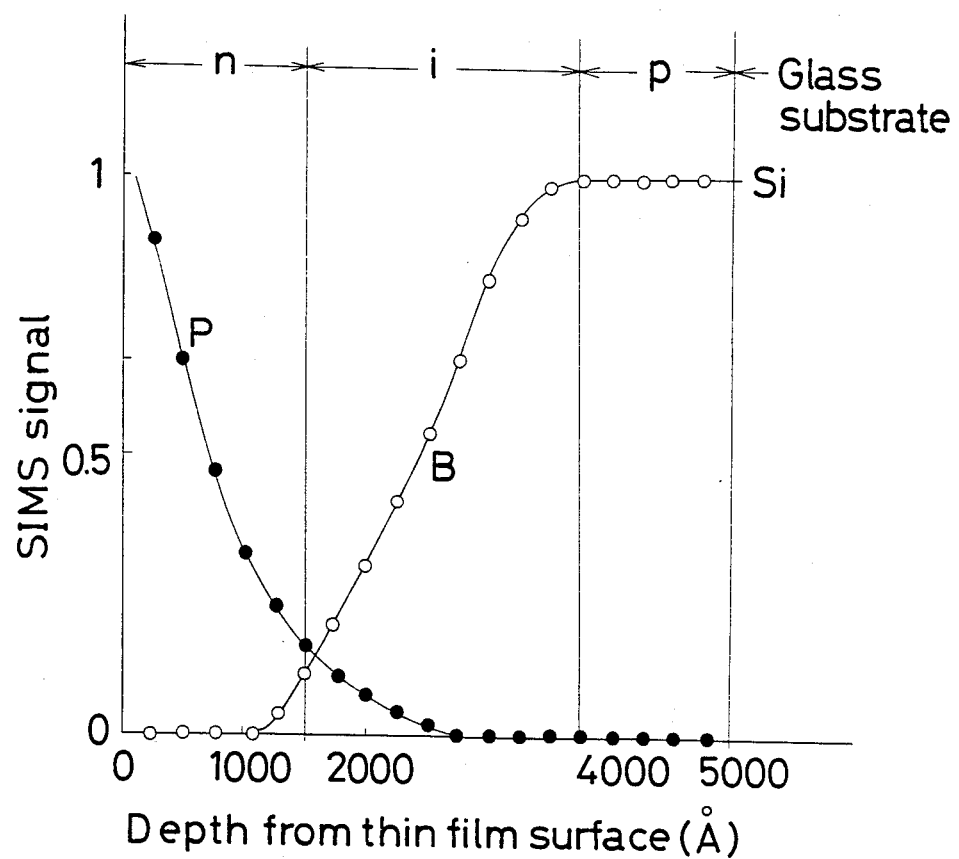
FIG. 5 is a graph in which the results of SIMS measurement of the thin silicon film produced by the second method are plotted.

In the same way as described in Example 3, a p-i-n junction device was made by treating a boron-doped, p-type thin film substrate of amorphous silicon (5000 Å in thickness) in a plasma atmosphere of a gaseous mixture of PH$_3$ gas and hydrogen gas. From its v-i characteristic the product was confirmed to be a p-i-n junction device. FIG. 5 gives the results of SIMS measurement. It will be understood from this graph that the phosphorus concentration in the substrate film decreases in the portion from the surface to a depth of 3500 Å and that the film is newly doped with phosphorus out of the gaseous mixture. The phosphorus concentration decreases in the portion of the thin film having an approximately zero concentration of boron and in at least part of the portion in which the boron concentration increases substantially linearly.

As has been described hereinabove, the method of the invention renders it possible to reduce the impurity concentration in a p- or n-type thin film substrate of silicon from the surface to a given depth and simultaneously dope the silicon film with a new impurity. Consequently, the method of the invention permits the manufacture of p-n or p-i-n junction devices with fewer film-forming steps than in ordinary methods. The invention thus offers advantages of simplified process and increased productivity of silicon semiconductors, with the possibility of producing diodes, solar cells, etc. of improved performance.

What is claimed is:

1. A thin film silicon semiconductor device comprising a substrate and a thin film of silicon, said substrate supporting said thin film, said thin film being doped with a dopant impurity element, the concentration of the dopant impurity element being substantially zero for a predetermined thickness beneath a boundary of said thin film and increasing substantially linearly from the zero concentration beneath the boundary to a substantially constant concentration within said thin film.

2. The thin film device in accordance with claim 1 in which the boundary is a major exposed surface.

3. The thin film device in accordance with claim 1 in which the dopant impurity concentration increases within 5000 Å of the boundary.

4. The thin film device in accordance with claim 3 in which the dopant impurity concentration increases within 3500 Å of the boundary.

5. The thin film device in accordance with claim 1 in which the impurity concentration is substantially zero within a thickness of approximately 1000 Å beneath the boundary.

6. The thin film device in accordance with claim 1 in which the thin film is a single-crystal of silicon.

7. The thin film device in accordance with claim 1 in which the thin film comprises amorphous silicon.

8. The thin film device in accordance with claim 1 in which the thin film comprises an amorphous silicon layer in which microcrystalline particles are mixed and dispersed.

9. The thin film device in accordance with claim 1 in which the thin film is doped with a second dopant impurity element which decreases in concentration from the boundary toward the portion of the silicon film having a maximum concentration of the first dopant impurity element.

10. The thin film device in accordance with claim 9 in which the second dopant impurity element decreases in concentration in the portion of the thin film adjacent to the boundary having a substantially zero concentration of the first dopant impurity element and at least part of the portion of the thin film in which the concentration of the first dopant impurity element increases substantially linearly.

11. The thin film device in accordance with claim 1 in which the impurity element concentration increases from the substantially zero concentration to the substantially constant concentration within a 2500 Å portion of the thin film.

12. A thin film silicon device comprising a substrate and a thin film of silicon, said substrate supporting said thin film, said thin film having a first portion and a second portion separated by a boundary, said first portion being doped with a dopant impurity having a concentration of substantially zero adjacent to the boundary, said dopant concentration increasing substantially linearly from the zero concentration adjacent to the boundary to a substantially constant concentration within the first portion between the boundary and the substrate, said second portion being substantially free of the dopant impurity, the dopant impurity concentration within said second portion being within a maximum of about $10^{16}$ atoms/cm$^3$.

13. The thin film device in accordance with claim 12 in which the dopant impurity concentration in the first portion increases within 5000 Å of the boundary.

14. The thin film device in accordance with claim 13 in which the dopant impurity concentration in the first portion increases within 3500 Å of the boundary.

15. The thin film device in accordance with claim 12 in which the dopant impurity concentration increases from the substantially zero concentration to the substantially constant concentration within a 2500 Å portion of the first portion.

* * * * *

UNITED STATES PATENT AND TRADEMARK OFFICE
CERTIFICATE OF CORRECTION

PATENT NO. : 4598304
DATED : July 1, 1986
INVENTOR(S) : Kazunobu Tanaka, et al.

It is certified that error appears in the above—identified patent and that said Letters Patent is hereby corrected as shown below:

On Page 1, Position 73, delete "Agency of Industrial Science & Technology; Toa Nenryo Kogya, K.K., both of Tokyo, Japan".

On Page 1, Position 73, insert --Agency of Industrial Science & Technology; Toa Nenryo Kogyo K.K., both of Tokyo, Japan--.

Signed and Sealed this

Twenty-third Day of December, 1986

Attest:

DONALD J. QUIGG

Attesting Officer     Commissioner of Patents and Trademarks